(12) United States Patent
Braceras et al.

(10) Patent No.: US 8,593,861 B2
(45) Date of Patent: Nov. 26, 2013

(54) ASYMMETRIC MEMORY CELLS

(75) Inventors: George M. Braceras, Essex Junction, VT (US); Krishnan S. Rengarajan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/269,942

(22) Filed: Oct. 10, 2011

(65) Prior Publication Data

US 2013/0088931 A1    Apr. 11, 2013

(51) Int. Cl.
*G11C 11/00* (2006.01)

(52) U.S. Cl.
USPC .......................................... 365/156; 365/154

(58) Field of Classification Search
USPC .................................................. 365/156, 154
See application file for complete search history.

(56) References Cited

U.S. PATENT DOCUMENTS

| | | | |
|---|---|---|---|
| 5,265,047 A | 11/1993 | Leung et al. | |
| 5,774,393 A | 6/1998 | Kuriyama | |
| 5,973,965 A | 10/1999 | Berthold et al. | |
| 6,061,268 A | 5/2000 | Kuo et al. | |
| 6,212,094 B1 | 4/2001 | Rimondi | |
| 6,341,083 B1 | 1/2002 | Wong | |
| 6,829,180 B2 | 12/2004 | Shau | |
| 6,934,182 B2 | 8/2005 | Chan et al. | |
| 7,301,793 B2 | 11/2007 | Kanehara et al. | |
| 7,724,565 B2 * | 5/2010 | Barth et al. | 365/154 |
| 7,768,816 B2 | 8/2010 | Joshi et al. | |

FOREIGN PATENT DOCUMENTS

WO    WO 2011013298 A1 *    2/2011

OTHER PUBLICATIONS

Nll et al. "A 45-nm single-port and dual-port SRAM family with robust read/write stabilizing circuitry under DVFS environment", 2008, p. 212-213.
Chiang et al. "A new SRAM cell design for both power and performance efficiency", 2009, p. 13-19.
Azam et al. "Robust asymmetric 6T-SRAM cell for low-power operation in nano-CMOS technologies", Electronics Letters, vol. 46, Issue 4, 2010, p. 273-274.
IBM "Stable SRAM cell technologies", 2007, p. 1-3.
Anonymous "Novel low power storage cells", 2011, p. 1-2.
Cserveny et al. Noise margin in low power SRAM cells', Lecture notes in computer science, 2004, 10 pages.
Aly et al. "Low-power cache design using 7T SRAM cell", Transaction on Circuits and Systems II: Express briefs, vol. 54, Issue 4, 2007, p. 318-322.

* cited by examiner

*Primary Examiner* — Jason Lappas
(74) *Attorney, Agent, or Firm* — David Cain; Roberts Mlotkowski Safran & Cole, P.C.

(57) ABSTRACT

An asymmetric memory cell is disclosed. The memory cell includes a refresh control line, a pass gate transistor, and a refresh transistor. The refresh transistor is coupled to the refresh control line, and provides a feedback between the pass gate transistor and a plurality of inverters, when the refresh control line is in a default state.

20 Claims, 8 Drawing Sheets

FIG. 9

ASYMMETRIC MEMORY CELLS

FIELD OF THE INVENTION

The invention relates to semiconductor structures and, more particularly, to asymmetric memory cells.

BACKGROUND

A static random access memory (SRAM) device is formed with memory cells which typically uses six MOSFETs to store each memory bit. A memory cell includes a wordline that controls two access transistors and two bitlines. The access transistors control access to a storage cell during read and write operations. More specifically, the access transistors control whether a storage cell should be exposed to the bitlines which are used to transfer data during read and write operations.

In each memory cell, the data is stored on four transistors that form two cross-coupled inverters that each have a pull-up PFET transistor and a pull-down NFET transistor. The interconnection node for the two transistors of each inverter is connected to the gate terminals of the two transistors of the other inverter. More specifically, the gate terminals of the transistors of the first inverter are connected to a first node, which is the series connection point of the drain terminals of the second inverter. Similarly, the gate terminals of the transistors of the second inverter are connected to a second node, which is the series connection point of the drain terminals of the first inverter. Additionally, each inverter is coupled to a bitline via an access transistor.

An SRAM memory cell has three operating states: standby, read, and write. During the standby state, the wordline is not asserted (i.e., the voltage remains in its default state) and the access transistors disconnect the cross-coupled inverters from the bitlines. However, the cross-coupled inverters will continue to retain the stored data so long as they remain connected to a power supply. As such, the data will be lost if the power supply is disconnected.

During a read operation, both the bitlines are precharged and the wordline is asserted, thereby activating the access transistors. The values stored in the nodes of the inverters are transferred to the bitlines by leaving one bitline at its precharged value and discharging the second bitline through the access transistor and pull-down transistor. Consequently, the precharged bitline will be drawn to the value stored in the memory cell.

During a write operation, the value to be written to the memory cell is applied to the bitlines. The wordline is then asserted (i.e., the voltage swings from its default state to a predetermined voltage) thereby activating the access transistors and exposing the memory cell to the bitlines. As such, the value of the bitlines is then written into the memory cell. However, the voltage of the bitlines must be sufficiently high enough to override the previous state of the cross-coupled inverters. More specifically, the bitlines voltage swing must be sufficiently large enough to write into the memory cell, thereby increasing power consumption.

Accordingly, there exists a need in the art to overcome the deficiencies and limitations described hereinabove.

SUMMARY

In an aspect of the invention, a memory cell comprises a refresh control line, a pass gate transistor, and a refresh transistor coupled to the refresh control line. The refresh transistor provides a feedback between the pass gate transistor and a plurality of inverters when the refresh control line is in a default state.

In an aspect of the invention, a circuit comprises one or more rows each including a wordline. The circuit further comprises a plurality of columns, where each column includes a bitline and a refresh control line. The circuit further comprises a memory cell located at each juncture of a row and a column. During a write operation, a first column of the plurality of columns writes into the memory cell, and during a read operation, the plurality of columns read data from the memory cell.

In an aspect of the invention, a method of operating a memory cell comprises writing data into a memory cell. The writing data in a memory cell comprises asserting a wordline and bitline, switching the refresh control line from a default state to an off state, which breaks a write feedback, and transferring data stored on the bitline to the memory cell.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the memory cell, which comprises the structures of the present invention. In still further embodiments, a method in a computer-aided design system is provided for generating a functional design model of the memory cell. The method comprises generating a functional representation of the structural elements of the memory cell.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

The invention relates to semiconductor structures and, more particularly, to asymmetric memory cells. The memory cell includes a pass gate transistor (PGT) connected in series with a refresh transistor. The memory cell also includes two MOSFET inverters that each have a pull-up PFET transistor and a pull-down NFET transistor. The memory cell utilizes a single bitline, a wordline, and a refresh control line to control the read and write operations.

Advantageously, the present invention provides an asymmetric memory cell with decreased cell size and improved writeability, readability, cell stability, and chip density. The writeability of the memory cell is increased as a result of utilizing broken feedback, which is a latch type function enabling the memory cell to be written into without overriding what was previously stored in the cell. The memory cell also provides for increased readability with the use of negative gate voltages. Readability is also improved because the absence of complementary bitlines reduces the probability of read failure. As a result of the increased speed of read operations, an increased number of memory cells per bitline may be utilized, thus improving the chip density and performance of a memory chip. Additionally, stability is improved because the pass gate transistor (PGT) quickly de-saturates and an evaluated bitline is less harmful to the memory cell.

Figure 1:
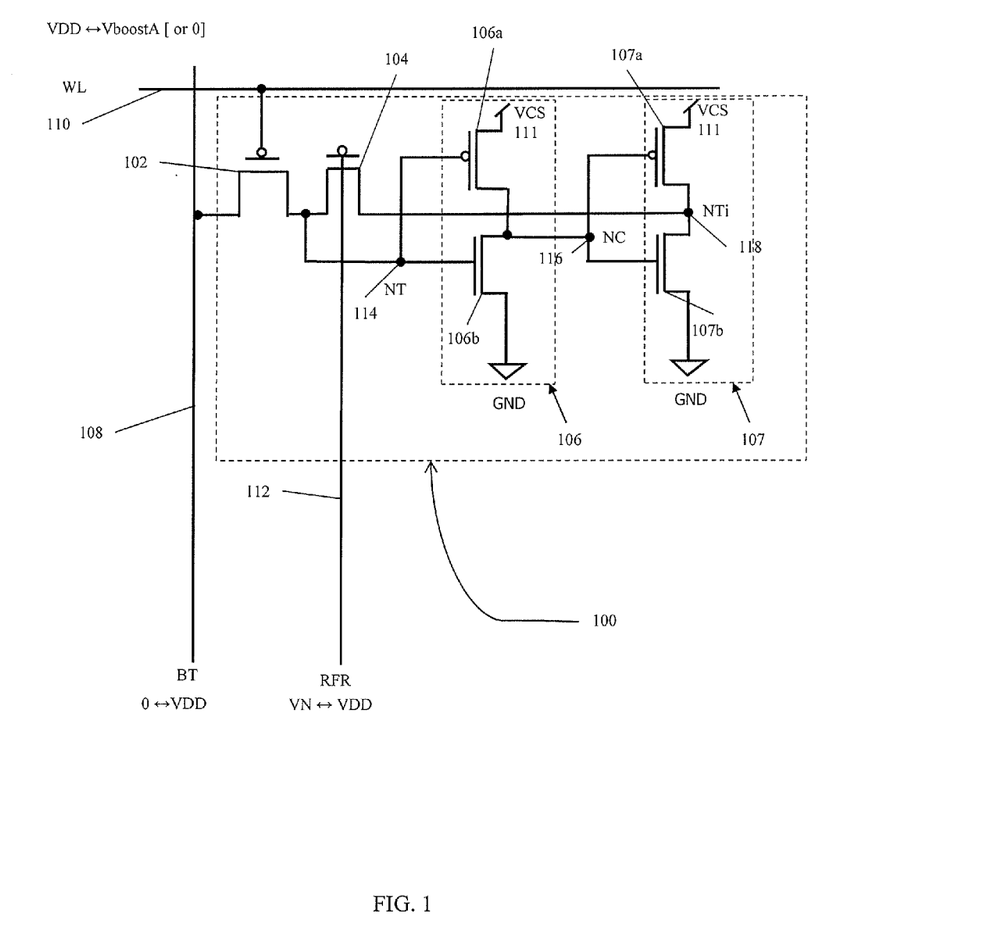
FIG. 1 shows a schematic of a memory cell according to aspects of the invention.

FIG. 1 shows a schematic of a memory cell according to aspects of the invention. More specifically, FIG. 1 shows a memory cell 100 having a PFET pass gate transistor (PGT) 102 connected in series with a PFET refresh transistor 104. The memory cell 100 also includes two MOSFET inverters 106 and 107 that each have a pull-up PFET transistor and a pull-down NFET transistor. More specifically, the first inverter 106 has a PFET transistor 106a and an NFET transistor 106b connected in series, and the second inverter 107 has a PFET transistor 107a and an NFET transistor 107b connected in series. The PFET transistors 106a and 107a are the pull-up transistors and the NFET transistors 106b and 107b are the pull-down transistors.

FIG. 1 also shows a single bitline 108 coupled a source of the PGT 102. The bitline 108 is used to transfer data for both read and write operations. Advantageously, the use of a single bitline decreases bitline leakage paths, thus improving performance. The default state of the bitline 108 is 0V, and when asserted, the bitline 108 swings to VDD.

A wordline 110 is coupled to a gate terminal of the PGT 102. The wordline 110 controls access to the PGT 102 during operation (i.e., data can be written to and read from the memory cell 100 when the wordline is asserted). The default state of the wordline 110 is VDD, and when asserted, the wordline 110 is negatively boosted to VboostA or 0V. When the wordline 110 is in its default state, the memory cell 100 is not exposed to the bitline 108, and consequently, the memory cell 100 is not susceptible to disturbances. Because the memory cell 100 utilizes a single PGT 102, the number of cells loading the wordline 110 is halved.

Additionally, a refresh control line 112 is coupled to a gate terminal of the refresh transistor 104. The refresh control line 112 is implemented in the present invention because a complementary bitline is not utilized. The default state of the refresh control line 112 is VN (i.e., negative voltage), and when it is turned off, the refresh control line 112 swings to VDD. The refresh control line 112 dictates the writeability of the memory cell 100. More specifically, the refresh transistor 104 and refresh control line 112 provide feedback which prevents the memory cell 100 from being written into when the refresh control line 112 is in the on state. The refresh control line 112 breaks the loop between the two inverters 106 and 107. In particular, when the refresh control line 112 is on, the loop between the inverters 106 and 107 is closed. As such, the information stored on the memory cell 100 will not be lost. When the refresh control line 112 is turned off, the feedback is broken and the memory cell 100 may be written into.

The schematic of FIG. 1 also shows a drain of the PGT 102 connected to a first node NT 114. Additionally, the gate terminals of the transistors 106a and 106b of the first inverter 106 are connected to node NT 114. The gate terminals of the transistors 107a and 107b of the second inverter 107 are connected to a second node NC 116, which is the series connection point of the drain terminals of the first inverter 106. The drain terminals of the transistors 104, 107a and 107b are connected to a node NTi 118. The source terminals of the PFET transistors 106a and 107a are connected to a voltage supply VCS 111. Furthermore, the source terminals of the NFET transistors 106b and 107b are connected to ground GND.

During a write operation, the refresh control line 112 is switched off (i.e., the voltage is driven high) thereby opening the circuit loop so the memory cell 100 may be written into. When the loop is opened and the bitline 108 and the wordline 110 are asserted (i.e., the voltage swings from 0V to VDD), the PGT 102 is turned on which flips node NT 114. This, in turn, flips node NC 116. This then flips node NTi 118. Consequently, node NTi 118 draws the data from the bitline 108 which is then stored in the memory cell 100. During the write operation, the memory cell 100 does not provide any write feedback (i.e., the feedback is broken), and as a result, the circuit can operate at a lower voltage which increases cell stability. This is because a higher voltage is no longer necessary to overdrive what was previously written into the cell.

Figure 2A:
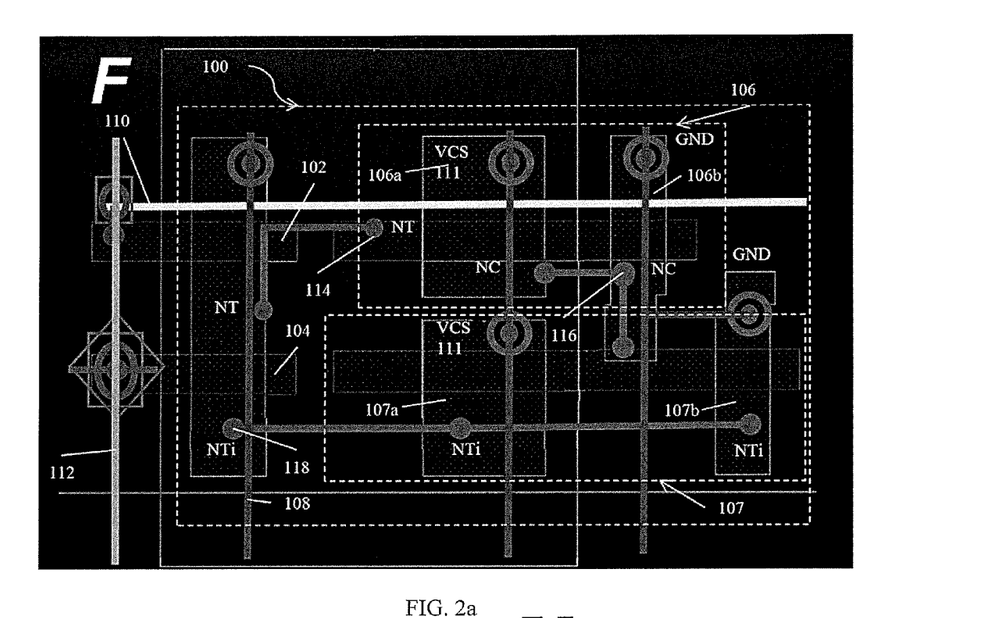
FIG. 2a shows a layout of a memory cell according to aspects of the invention.

FIG. 2a shows a layout of a memory cell according to aspects of the invention. More specifically, FIG. 2a shows a memory cell 100 having a PFET pass gate transistor (PGT) 102 connected in series with a PFET refresh transistor 104. The memory cell 100 also includes two MOSFET inverters 106 and 107 that each have a pull-up PFET transistor and a pull-down NFET transistor. More specifically, the first inverter 106 has a PFET transistor 106a and an NFET transistor 106b connected in series, and the second inverter 107 has a PFET transistor 107a and an NFET transistor 107b connected in series. The PFET transistors 106a and 107a are the pull-up transistors and the NFET transistors 106b and 107b are the pull-down transistors.

FIG. 2a also shows a single bitline 108 coupled to the source of the PGT 102, and a wordline 110 coupled to the gate terminal of the PGT 102. Additionally, a refresh control line 112 is coupled to the gate terminal of the transistor 104. The drain of the PGT 102 is connected to a first node NT 114. The gate terminals of the transistors 106a and 106b of the first inverter 106 are connected to node NT 114. The gate terminals of the transistors 107a and 107b of the second inverter 107 are connected to a second node NC 116, which is the series connection point of the drain terminals of the first inverter 106. The drain terminals of the transistors 104, 107a and 107b are connected to the node NTi 118. The source terminals of the PFET transistors 106a and 107a are connected to a voltage supply VCS 111. Furthermore, the source terminals of the NFET transistors 106b and 107b are connected to ground GND.

Figure 2B:
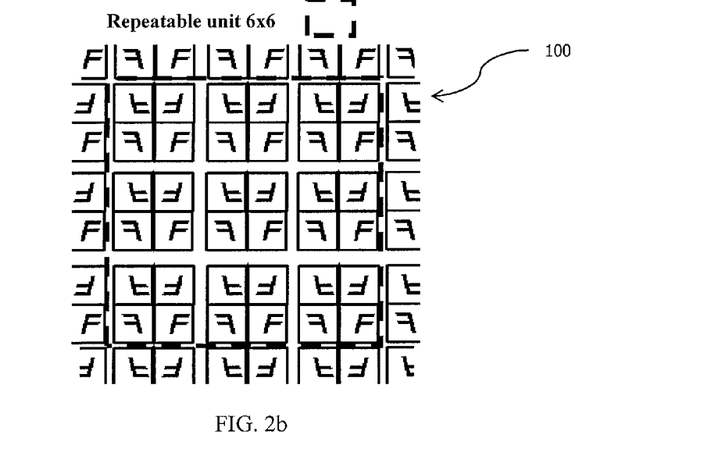
FIG. 2b shows a design layout of multiple memory cells according to aspects of the invention.

FIG. 2b shows a design layout of multiple memory cells 100 according to aspects of the invention. More specifically, FIG. 2b shows a design layout of the memory cell 100 of FIG. 2a. The design layout shows that the memory cells 100 can be clustered in groups of four; although other clustering is contemplated by the present invention. Additionally, the design layout shows the orientation of each cell within the cluster of cells.

Figure 3:
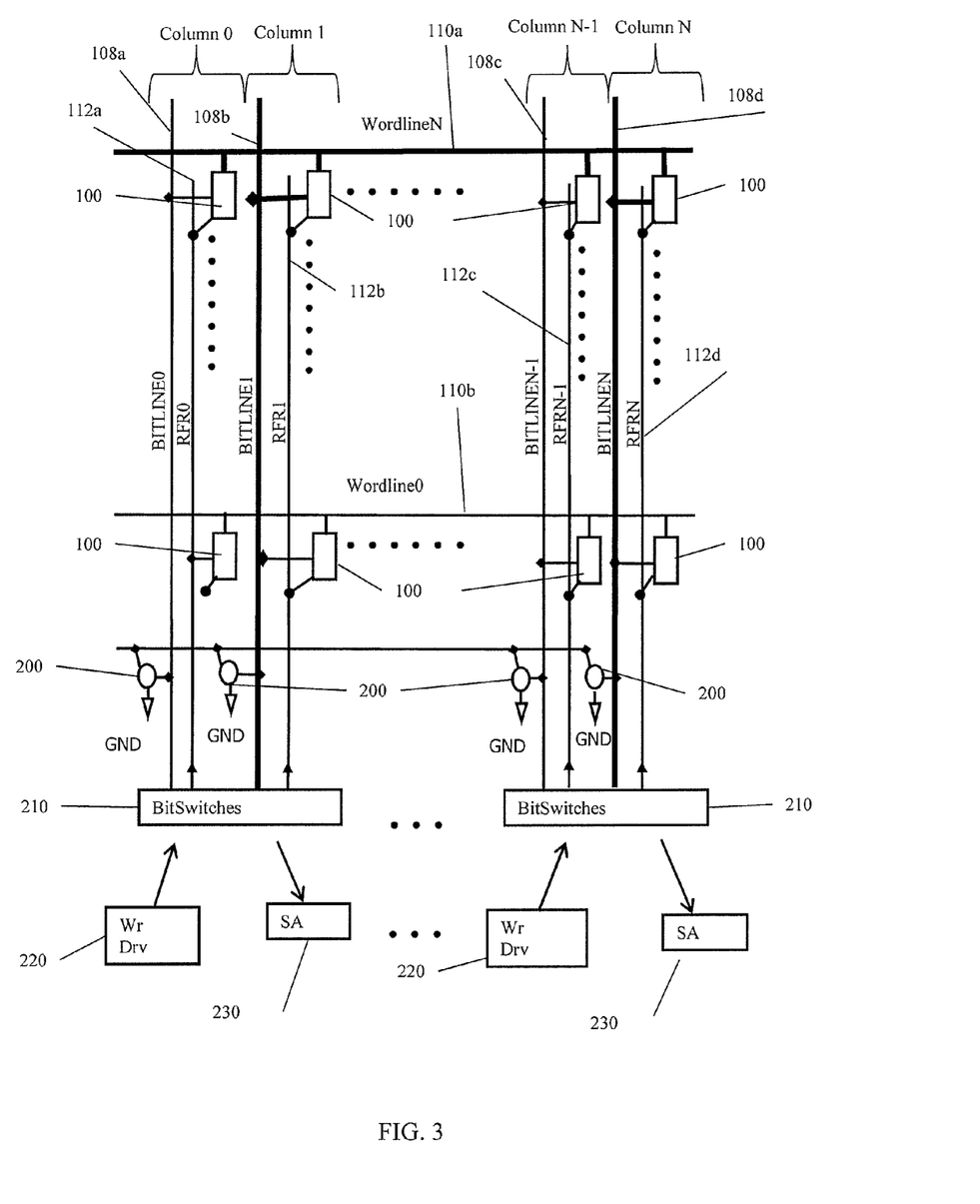
FIG. 3 shows a circuit design according to aspects of the invention.

FIG. 3 shows a circuit design according to aspects of the invention. In particular, the memory cell 100 of FIG. 1 is integrated into a memory array or matrix that includes one or more rows and a plurality of columns as shown in FIG. 3. Each row is identified with a wordline and each column is identified with a bitline and a control line pair. For example, the array of FIG. 3 has two rows denoted by WordlineN 110a and Wordline0 110b and four columns denoted by BITLINE0 108a and RFR0 112a, BITLINE1 108b and RFR1 112b, BITLINEN-1 108c and RFRN-1 112c, and BITLINEN 108d and RFRN 112d, wherein the four columns are represented as column 0, column 1, column N-1, and column N, respectively. A memory cell 100 is located at each juncture of a row and column. It should be understood that the circuit design of FIG. 3 is an exemplary design and that more or less than two rows or columns are contemplated with regard to the present invention.

The circuit design of FIG. 3 shows a predischarge circuit 200 connected to each bitline BITLINE0, BITLINE1, BITLINEN-1, and BITLINEN, to draw the bitlines to ground GND. In embodiments, the predischarge circuit 200 may be in a recharged state, or may be used for further processing. Additionally, a BitSwitch multiplexer 210 is coupled to a Write Driver 220 and two columns, for example, column 0 and column 1. The BitSwitch multiplexer 210 can access one of the two columns by decoding the column addresses. Accordingly, during a write operation, the Write Driver 220 sends a digital signal to the BitSwitch multiplexer 210 which decodes the signal and determines which bitline has been asserted. The data is transmitted along the asserted bitline, and when a wordline is also asserted, the data is written into the memory cell 100 at the juncture of the asserted bitline and asserted wordline. The BitSwitch multiplexer 210 is also coupled to a Sense Amp 230. During a read operation, the data is sent to the BitSwitch multiplexer 210 via a bitline, for example, BITLINE0, the BitSwitch multiplexer 210 decodes the data, and the BitSwitch multiplexer 210 relays the decoded data to the Sense Amp 230. Subsequently, the Sense Amp 230 reads the data received, converts the data into a digital signal, and amplifies the data signal so it may be read by electronic devices, microprocessor devices, and/or other computing applications.

Each BitSwitch multiplexer 210 is coupled to two columns, for example, column 0 and column 1, however, only one column writes to a memory cell 100 at a time. As such, when a bitline is asserted, only memory cells exposed to the asserted bitline may be written into. It should be understood that the circuit design of FIG. 3 is an exemplary design and that more than two columns coupled to the BitSwitch multiplexer 210 are contemplated with regard to the present invention. For example, the present invention may be implemented with four columns, eight columns, sixteen columns, etc., coupled to the BitSwitch multiplexer 210. In embodiments, memory cells 100 are exposed to the bitline when a wordline is asserted; whereas the memory cells 100 are isolated from the bitline when a wordline is unasserted. As described above, the Write Driver 220 sends a digital signal to the BitSwitch multiplexer 210 which decodes the signal and determines which bitline has been asserted. The data is transmitted along the asserted bitline and is written into the memory cell 100 at the juncture of an asserted column and an asserted wordline.

For example, when BITLINE1 108b and WordlineN are asserted and RFR1 112b is turned off such that the feedback is broken, the memory cell 100 connected to column 1 and WordlineN is exposed to the asserted bitline, and therefore, may be written into. The broken feedback will cause the memory cells to float for a short period of time, however, they will not be disturbed by any secondary disturbances. On the other hand, when a bitline is not asserted, the memory cell 100 may not be written into. For instance, when BITLINE0 108a is not asserted and RFR0 112a remains on such that the feedback is active the memory cell 100 is isolated from BITLINE0 108a. Consequently, the memory cells 100 connected to column 0 may not be written into. The refresh control line RFR0 112a remains on to preserve the information located in the memory cell 100. More specifically, when the refresh control line RFR0 112 is on, the memory cells 100 are isolated from the bitline BITLINE0 108a, and therefore, the memory cells are not susceptible to disturbances.

In embodiments, when a bitline is not asserted, the memory cells 100 are not written into because the wordline is isolated from the bitline. However, when a bitline is not asserted, data may be read from the memory cell when a wordline is asserted because an unasserted bitline is always in a read mode. For example, when WordlineN 110a is asserted and BITLINE0 108a is not asserted, the unasserted bitline would read data from the memory cell 100 located at the juncture of the column 0 and WordlineN 110a. Data from a memory cell located at the juncture of an unasserted bitline and an unasserted wordline cannot be read.

Figure 4:
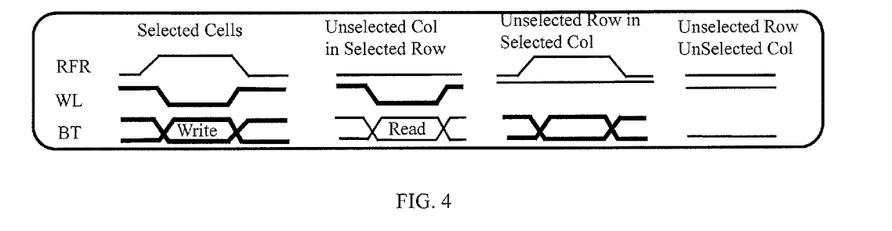
FIG. 4 shows a write/read operation of a memory cell according to aspects of the invention.

FIG. 4 shows a write/read operation of a memory cell according to aspects of the invention. More specifically, FIG. 4 shows the write operation of a selected cell (i.e., both the wordline (WL) and bitline (BT) have been asserted). During this write operation, the refresh control line (RFR) is turned off, opening the circuit loop so the memory cell may be written into. The wordline is drawn to VboostA from its default state VDD and the bitline is driven from 0V to VDD. In embodiments, the Write Driver sends a digital signal to the BitSwitch multiplexer which decodes the signal and determines which bitline has been asserted. The data is then transmitted to the asserted bitline and deposited into the selected memory cell. As a result, data sent from the BitSwitch multiplexer to the bitline is written into the selected memory cell. During the write operation, the cells in the adjacent column(s) will put the data onto the bitlines; however, the data is not actually read out of the memory cell because read circuits are shut off during a write operation.

FIG. 4 also shows the read operation of an unselected column (i.e., unasserted bitline) in a selected row (i.e., asserted wordline). During this read operation, the refresh control line remains on, thus providing feedback which, in turn, prevents data from being written into the memory cell. In embodiments, the wordline is drawn to VboostA from its default state VDD, thus exposing the wordline to the bitline. Because the columns operate in pairs as discussed with respect to FIG. 3, the unasserted bitline remains in its default state of 0V. Additionally, the bitline of an unselected column is always in a read mode. Consequently, when the refresh control line is on and the wordline is asserted, data is passed from the memory cell to the bitline. The data on the bitline is sent to the BitSwitch multiplexer which is then decoded and relayed to the Sense Amp. The Sense Amp reads the data received from the bitline, converts the data into a digital signal, and amplifies the data signal so it may be read by electronic devices, microprocessor devices, and/or other computer applications. During a read operation, the memory cell of the selected row in one of the plurality of columns will be selected to be read out through periphery circuits, and at that time, the other unselected columns will have the bitlines updated from the memory cell data corresponding to the same selected row.

FIG. 4 further shows the operation of an unselected row (i.e., unasserted wordline) and a selected column (i.e., asserted bitline). During this operation, the wordline remains in its default state VDD and the bitline is driven from 0V to VDD. When a wordline is unasserted it is disconnected from the bitline, and the memory cell is isolated from the bitline because coupling cannot occur.

FIG. 4 also shows the operation of the memory cell when the bitline and wordline are not asserted (i.e., the voltage of the bitline and wordline remain in their default state). The refresh control line remains on, thus providing feedback which prevents data from being written into the memory cell. Because both the bitline and wordline are both unasserted data, cannot be read from the memory.

Figure 5:
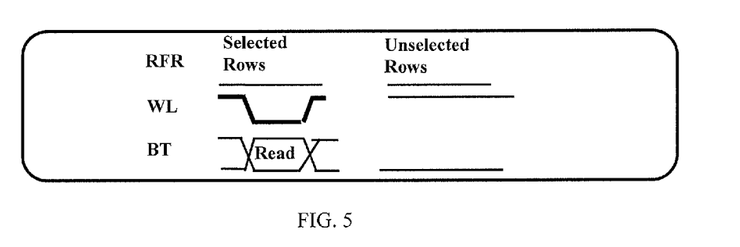
FIG. 5 shows a read operation of a memory cell according to aspects of the invention.

FIG. 5 shows a read operation of a memory cell according to aspects of the invention. More specifically, FIG. 5 shows the read operation of selected rows (i.e., an asserted wordline (WL)). During this read operation, the refresh control line (RFR) remains on, thus providing feedback which prevents data from being written into the memory cell. In embodiments, the wordline is drawn to VboostA from its default state VDD, thus exposing the wordline to the bitline (BT). When a bitline is not asserted, it is in a read mode. Consequently, when the refresh control line is on and the wordline is asserted, information is passed from the memory cell to the bitline. The data on the bitline is sent to the BitSwitch multiplexer which is then decoded and relayed to the Sense Amp. The Sense Amp reads the data received from the bitline, converts the data into a digital signal, and amplifies the data signal so it may be read.

FIG. 5 further shows the read operation of an unselected row (i.e., the wordline is not asserted). During this operation, the wordline remains in its default state, therefore the wordline is not exposed to the bitline. Consequently, data is not read from the memory cell. Additionally, the refresh control line remains on, thus providing feedback which prevents data from being lost.

Figure 6:
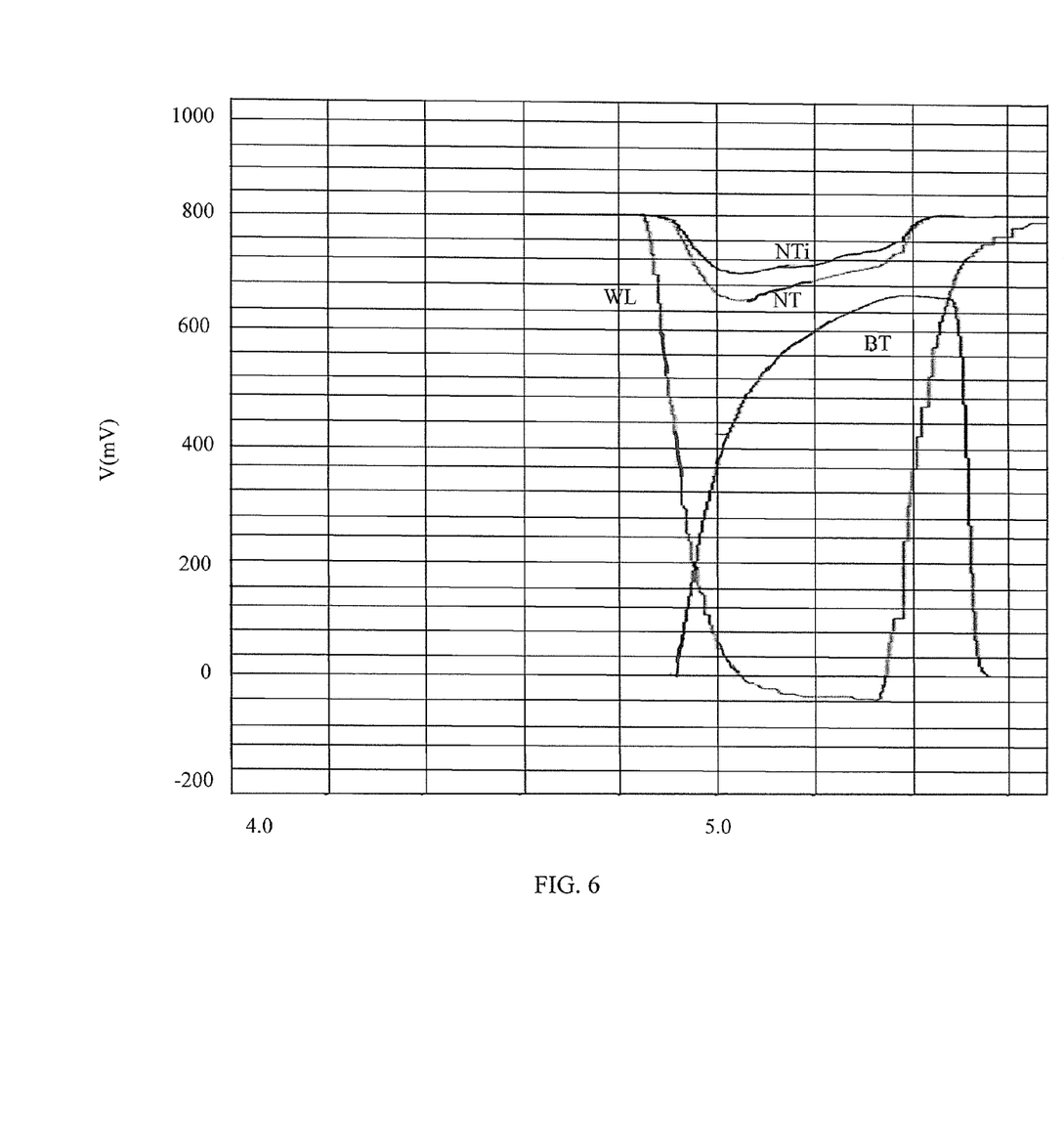
FIG. 6 shows a performance graph of a memory cell during a read operation according to aspects of the invention.

FIG. 6 shows a performance graph of a memory cell during a read operation according to aspects of the invention. In particular, the graph shows the performance at node NT compared to node NTi during a read operation. During a read operation, the wordline WL is asserted, the bitline BT evaluates the value stored in the memory cell, and the information is pulled toward the bitline which causes a read disturbance. In embodiments, static feedback may be provided to make the memory cell immune from disturbances. The yield at node NT will also be reduced by disturbances caused by an asserted wordline. Nonetheless, the node NT produces high yield which provides faster reading of the memory cell and prevents the node NT from flipping.

Figure 7:
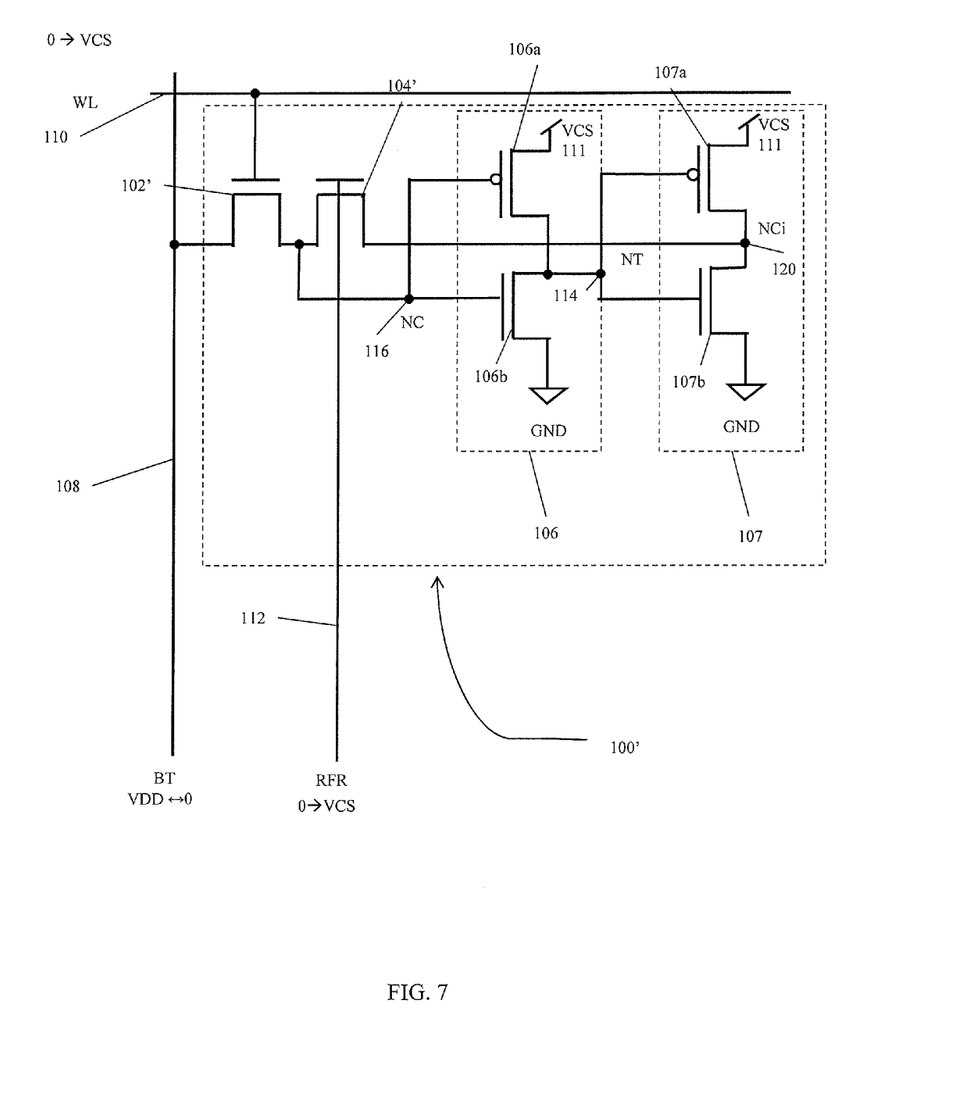
FIG. 7 shows an alternate schematic of a memory cell according to aspects of the invention.

FIG. 7 shows an alternate schematic of a memory cell according to aspects of the invention. In this schematic, a memory cell includes an NFET pass gate transistor and an NFET refresh transistor. In this embodiment, the location of nodes NT and NC are reversed, and the third node is NCi. In embodiments, the default state of the bitline is VDD, and when asserted, the bitline swings to 0V. Also, the default state of the wordline is 0V, and when asserted, the wordline swings to VCS. The default state of the refresh control line is 0V, and when asserted, the refresh control line swings to VCS.

More specifically, FIG. 7 shows a memory cell 100' having an NFET pass gate transistor (PGT) 102' connected in series to an NFET refresh transistor 104'. The memory cell 100' also includes two MOSFET inverters 106 and 107 that each have a pull-up PFET transistor and a pull-down NFET transistor. More specifically, the first inverter 106 has a PFET transistor 106a and an NFET transistor 106b connected in series, and the second inverter 107 has a PFET transistor 107a and an NFET transistor 107b connected in series. The transistors 106a and 107a are the pull-up transistors and 106b and 107b are the pull-down transistors.

FIG. 7 also shows a single bitline 108 coupled to a source of the PGT 102'. The bitline 108 is used to transfer data for both read and write operations. Advantageously, the use of a single bitline decreases bitline leakage paths, thus improving overall performance. The default state of the bitline 108 is VDD, and when asserted, the bitline 108 swings to 0V.

A wordline 110 is coupled to a gate terminal of the PGT 102'. The wordline 110 controls access to the PGT 102' during operations (i.e., data can only be read from the memory cell when the wordline is asserted). The default state of the wordline 110 is 0V, and when asserted, the wordline swings to VCS. Because the memory cell 100' utilizes a single PGT 102', the number of cells loading the wordline 110 is halved.

Additionally, a refresh control line 112 is coupled to a gate terminal of the refresh transistor 104'. The default state of refresh control line 112 is 0V, and when it is turned off, the refresh control line 112 swings to VCS. The refresh control line 112 dictates the writeability of the memory cell. More specifically, the refresh transistor 104 and refresh control line 112 provide feedback which prevents the memory 100' from being written into when the refresh control line 112 is in the on state. When the refresh control line 112 is turned off, the feedback is broken and the memory cell 100 may be written into.

The schematic of FIG. 7 also shows a drain of the PGT 102' connected to a first node NC 116. Additionally, the gate terminals of the transistors 106a and 106b of the first inverter 106 are connected to node NC 116. The gate terminals of the transistors 107a and 107b of the second inverter 107 are connected to a second node NT 114, which is the series connection point of the drain terminals of the first inverter 106. Additionally, the drain terminals of the transistors 104, 107a and 107b are connected to node NCi 118. The source terminals of the PFET transistors 106a and 107a are connected to a voltage supply VCS 111. Furthermore, the source terminals of the NFET transistors 106b and 107b are connected to ground GND.

During a write operation, the refresh control 112 is switched off (i.e., the voltage is driven high) thereby opening the circuit loop so the memory cell 100' may be written into. When the loop is opened and the bitline and wordline are asserted, the PGT 102' is turned on which flips node NC 116 which, in turn, flips node NT 114. This then flips node NCi 120. Consequently, node NCi 120 draws the data from the bitline 108 which is then stored in the memory cell 100'. During the write operation, the memory cell 100' does not provide any write feedback, and as a result, the circuit can operate at a lower voltage which increases cell stability. This is because a higher voltage is no longer necessary to overdrive what was previously written into the cell.

Figure 8:
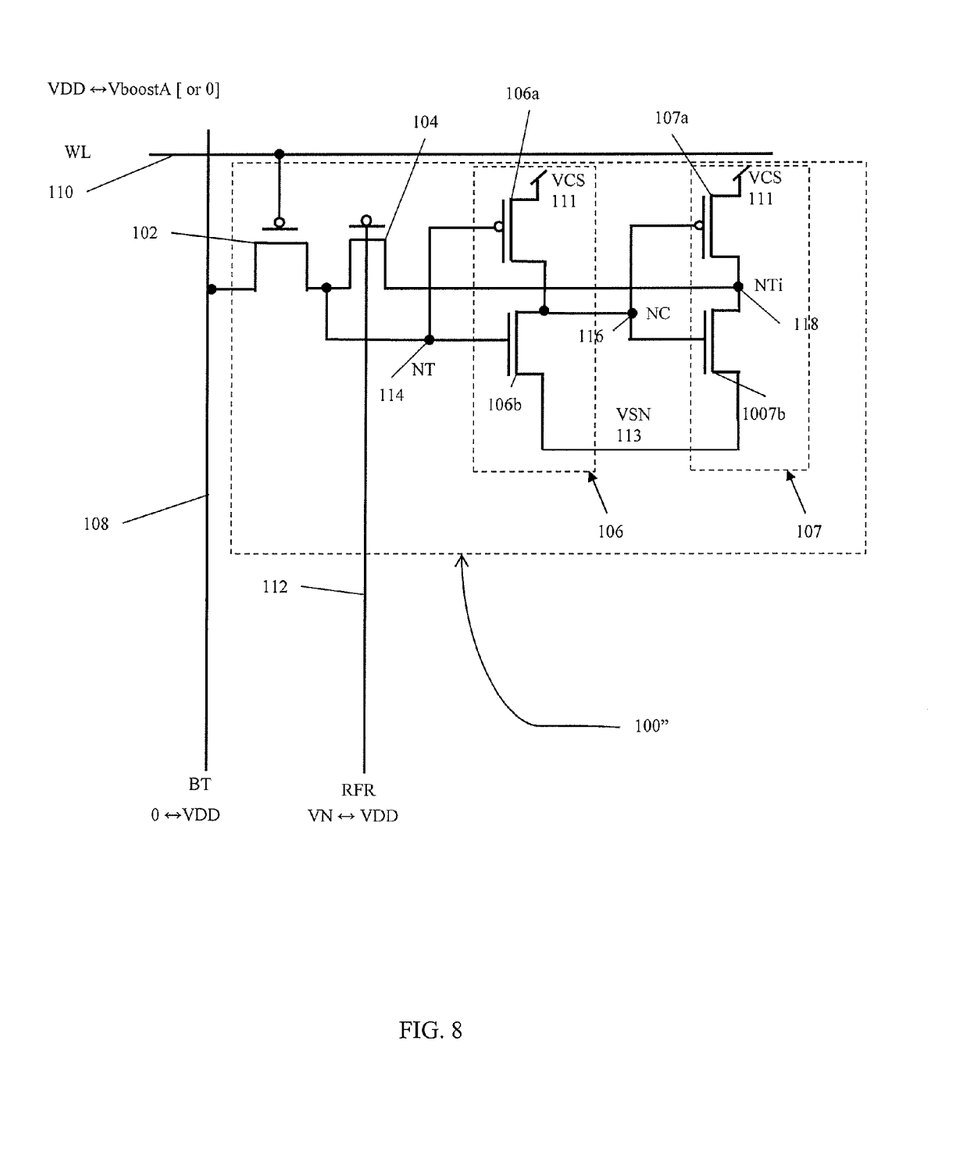
FIG. 8 shows an alternate schematic of a memory cell according to aspects of the invention.

FIG. 8 shows a schematic of a memory cell according to aspects of the invention. In this schematic, the source terminals of the NFET pull-down transistors are connected to VSN. More specifically, FIG. 8 shows a memory cell 100" having a PFET pass gate transistor (PGT) 102 connected in series with a PFET refresh transistor 104. The memory cell 100" also includes two MOSFET inverters 106 and 107 that each have a pull-up PFET transistor and a pull-down NFET transistor. More specifically, the first inverter 106 has a PFET transistor 106a and an NFET transistor 106b connected in series, and the second inverter 107 has a PFET transistor 107a and an NFET transistor 107b connected in series. The PFET transistors 106a and 107a are the pull-up transistors and the NFET transistors 106b and 107b are the pull-down transistors.

FIG. 8 also shows a single bitline 108 coupled to a source of the PGT 102. The bitline 108 is used to transfer data for both read and write operations. Advantageously, the use of a single bitline decreases bitline leakage paths, thus improving performance. The default state of the bitline 108 is 0V, and when asserted, the bitline 108 swings to VDD.

A wordline 110 is coupled to a gate terminal of the PGT 102. The wordline 110 controls access to the PGT 102 during operations (i.e., data can only be written to and read from the memory cell when the wordline is asserted). The default state of the wordline 110 is VDD, and when asserted, the wordline is negatively boosted to VboostA or 0V. Because the memory cell 100" utilizes a single PGT 102, the number of cells loading the wordline 110 is halved.

Additionally, a refresh control line 112 is coupled to a gate terminal of the refresh transistor 104. The default state of refresh control line 112 is VN (i.e., negative voltage), and when it is turned off, the refresh control line swings to VDD. The refresh control line 112 dictates the writeability of the memory cell 100". More specifically, the refresh transistor 104 and refresh control line 112 provide feedback which prevents the memory from being written into when the refresh control line 112 is in the on state. When the refresh control line 112 is turned off, the feedback is broken and the memory cell 100 may be written into.

The schematic of FIG. 8 also shows a drain of the PGT 102 connected to a first node NT 114. Additionally, the gate terminals of the transistors 106a and 106b of the first inverter 106 are connected to node NT 114. The gate terminals of the transistors 107a and 107b of the second inverter 107 are connected to a second node NC 116, which is the series connection point of the drain terminals of the first inverter 106. The drain terminals of the transistors 104, 107a and 107b are connected to node NTi 118. The source terminals of the PFET transistors 106a and 107a are connected to a voltage supply VCS 111. Furthermore, the source terminals of the NFET transistors 106b and 107b are connected to VSN 113.

During a write operation, the refresh control line 112 is switched off (i.e., the voltage is driven high) thereby opening the circuit loop so the memory cell 100" may be written into. When the loop is opened and the bitline and wordline are asserted, PGT 102 is turned on which flips node NT 114 which, in turn, flips node NC 116. This then flips node NTi 118. Consequently, node NTi 118 draws the data from the bitline 108 which is then stored in the memory cell 100". During the write operation, the memory cell 100" does not provide any write feedback, and as a result, the circuit can operate at a lower voltage which increases cell stability. This is because a higher voltage is no longer necessary to overdrive what was previously written into the cell.

Figure 9:
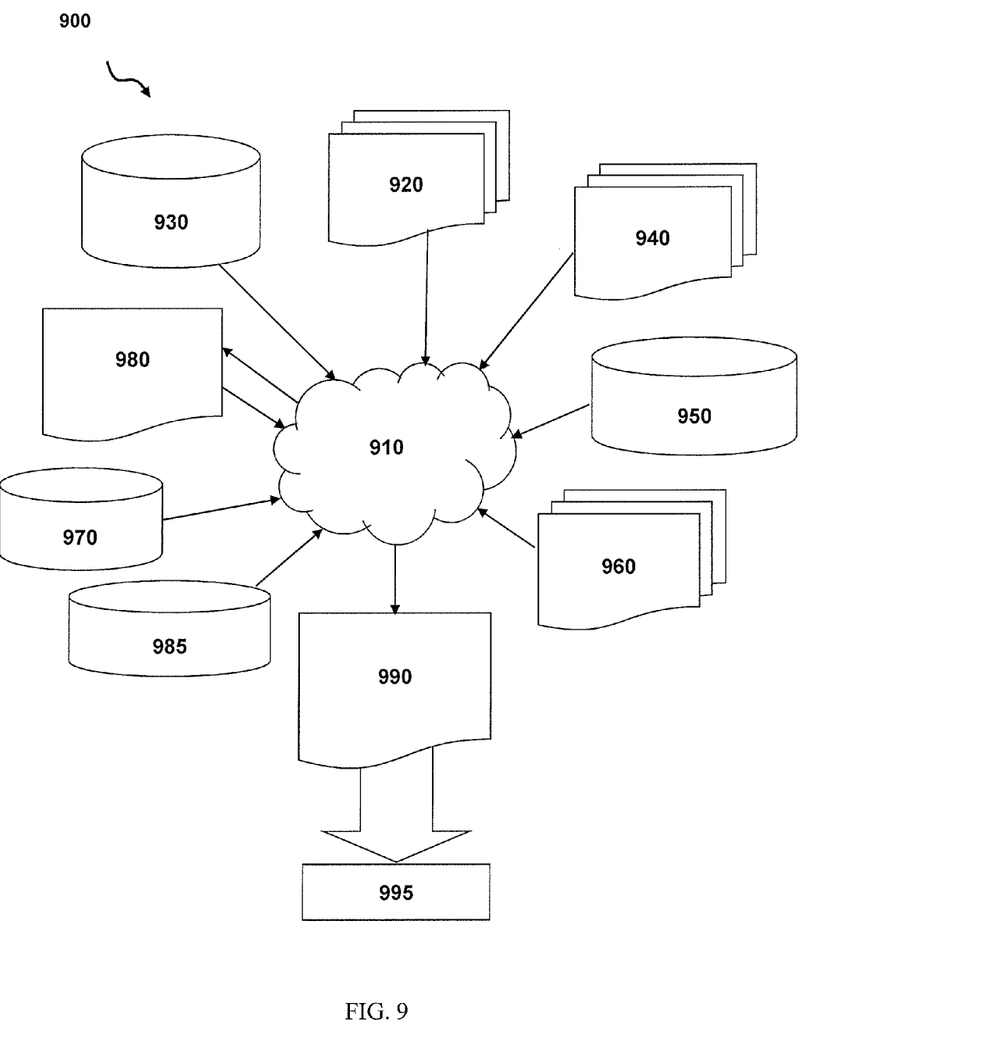
FIG. 9 is a flow diagram of a design process used in semiconductor design, manufacture, and/or test.

FIG. 9 is a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2a, 2b, 3, 7 and 8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2a, 2b, 3, 7 and 8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2a, 2b, 3, 7 and 8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a, 2b, 3, 7 and 8. In one embodiment, design structure 990 may comprise a compiled, executable HDL simulation model that functionally simulates the devices shown in FIGS. 1, 2a, 2b, 3, 7 and 8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a, 2b, 3, 7 and 8. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A memory cell, comprising:
   a single bitline, a wordline and a refresh control line that control reading and writing of the memory cell; and
   a pass gate transistor coupled in series with a refresh transistor;
   wherein:
      the refresh transistor coupled to the refresh control line, and
      the refresh transistor provides a feedback between the pass gate transistor and a plurality of inverters when the refresh control line is in a default state.

2. The memory cell of claim 1, wherein the single bitline is coupled to the pass gate transistor.

3. The memory cell of claim 2, wherein the wordline is coupled to the pass gate transistor.

4. The memory cell of claim 1, wherein the plurality of inverters comprises a first inverter and a second inverter.

5. The memory cell of claim 4, wherein:
   the first inverter includes a pull-up transistor and a pull-down transistor; and
   the second inverter includes a pull-up transistor and a pull-down transistor.

6. The memory cell of claim 5, wherein the pull-up transistors of the first and second inverters are connected to a first voltage source.

7. The memory cell of claim 5, wherein pull-down transistors of the first and second inverters are coupled to ground.

8. The memory cell of claim 5, wherein the pull-down transistors of the first and second inverters are coupled to a second voltage supply.

9. The memory cell of claim 1, wherein the default state is a negative voltage.

10. The memory cell of claim 1, wherein the pass gate transistor and the refresh transistor are NFETs.

11. The memory cell of claim 1, wherein the pass gate transistor and the refresh transistor are PFETs.

12. The memory cell of claim 1, further comprising:
a first node;
a second node; and
a third node, wherein:
the first node is connected to a drain of the pass gate transistor and gates of a first transistor and a second transistor of a first inverter of the plurality of inverters;
the second node is connected to drains of the transistors of the first inverter and gates of a first transistor and a second transistor of a second inverter of the plurality of inverters; and
the third node is connected to drains of the transistors of the second inverter and a drain of the refresh transistor.

13. The memory cell of claim 12, wherein, during a write operation:
the bitline is asserted, which flips the first node;
the first node flips the second node;
the second node flips the third node, and
the third nodes draws the data stored on the asserted single bit line into the memory cell.

14. A method of operating a memory cell, comprising:
writing data into a memory cell comprising:
asserting a wordline and bitline;
switching a refresh control line from a default state to an off state, which breaks a write feedback;
transferring data stored on the bitline to the memory cell; and
reading data from the memory cell comprising:
asserting the wordline;
maintaining the bitline and the refresh control line in a default state; and
transferring data stored in the memory to the bitline.

15. The method of claim 14, wherein:
the default state of the wordline is a positive voltage; and
the asserting the wordline comprises negatively boosting the positive voltage of the wordline.

16. The method of claim 15, wherein:
the default state of the refresh control line is a negative voltage; and
the switching the refresh control line from the default state to the off state comprises switching the refresh control line to a positive voltage.

17. The memory cell of claim 1, wherein:
a gate of the refresh transistor connects to the refresh control line;
a drain of the pass gate transistor connects to a drain of the refresh transistor; and
a source of the pass gate transistor connects to a bit line.

18. The memory cell of claim 17, wherein:
the plurality of inverters comprises a first inverter and a second inverter;
the first inverter includes a first NFET and a first PFET;
the second inverter includes a second NFET and a second PFET;
a source of the refresh transistor connects to a drain of the second NFET and a drain of the second PFET;
a node connects a drain of the first NFET and a drain of the first PFET; and
the node connects a gate of the second NFET and a gate of the second PFET.

19. The memory cell of claim 18, wherein the drain of the refresh transistor only connects to a gate of the first NFET and a gate of the first PFET.

20. The memory cell of claim 1, wherein the memory cell includes only the one pass gate transistor.

* * * * *